(12) United States Patent
Mitchell et al.

(10) Patent No.: US 6,679,675 B2
(45) Date of Patent: Jan. 20, 2004

(54) METHOD AND APPARATUS FOR PROCESSING WAFERS

(75) Inventors: Robert J. C. Mitchell, West Sussex (GB); Keith D. Relleen, West Sussex (GB); John Ruffell, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 177 days.

(21) Appl. No.: 09/996,805

(22) Filed: Nov. 30, 2001

(65) Prior Publication Data

US 2002/0034433 A1 Mar. 21, 2002

Related U.S. Application Data

(62) Division of application No. 09/293,939, filed on Apr. 19, 1999, now Pat. No. 6,350,097.

(51) Int. Cl.$^7$ .............................................. B65G 49/07
(52) U.S. Cl. .............................. 414/744.3; 414/744.8; 414/941
(58) Field of Search .......................... 414/217, 222.09, 414/226.01, 226.05, 744.2, 744.3, 744.8, 805, 806, 939, 941; 901/17

(56) References Cited

U.S. PATENT DOCUMENTS

| | | | | |
|---|---|---|---|---|
| 3,885,678 A | * | 5/1975 | Borg et al. ................. 901/17 |
| 4,098,088 A | * | 7/1978 | Mason ........................ 901/17 |
| 4,501,527 A | * | 2/1985 | Jacoby et al. .......... 414/222.13 |
| 4,632,624 A | | 12/1986 | Mirkovich et al. |
| 5,092,729 A | | 3/1992 | Yamazaki et al. |
| 5,100,502 A | | 3/1992 | Murdoch et al. |
| 5,183,370 A | * | 2/1993 | Cruz .......................... 414/277 |
| 5,584,647 A | | 12/1996 | Uehara et al. |
| 5,647,724 A | * | 7/1997 | Davis et al. ............. 414/744.5 |
| 5,733,096 A | * | 3/1998 | Van Doren et al. ......... 212/296 |
| 5,765,889 A | * | 6/1998 | Nam et al. ................. 294/64.1 |
| 5,851,296 A | | 12/1998 | Haraguchi et al. |
| 5,857,826 A | | 1/1999 | Sato et al. |
| 5,894,760 A | * | 4/1999 | Caveney .................. 74/490.03 |
| 5,909,994 A | | 6/1999 | Blum et al. |
| 5,913,652 A | * | 6/1999 | Zejda ...................... 198/346.2 |
| 5,961,269 A | | 10/1999 | Kroeker |
| 6,053,686 A | | 4/2000 | Kyogoku |
| 6,059,507 A | | 5/2000 | Adams et al. |
| 6,062,798 A | | 5/2000 | Muka |
| 6,066,210 A | | 5/2000 | Yonemitsu et al. |
| 6,132,165 A | * | 10/2000 | Carducci ................. 414/744.5 |
| 6,176,667 B1 | * | 1/2001 | Fairbairn et al. .......... 414/217 |
| 6,190,103 B1 | * | 2/2001 | Erez et al. .................. 294/106 |
| 6,190,114 B1 | * | 2/2001 | Ogawa et al. ........... 414/744.5 |
| 6,371,713 B1 | * | 4/2002 | Nishimura et al. .... 414/222.13 |
| 6,382,902 B1 | * | 5/2002 | Sugimura ................... 118/719 |
| 6,450,755 B1 | * | 9/2002 | Cameron et al. ....... 414/416.08 |
| 6,481,956 B1 | * | 11/2002 | Hofmeister ................. 414/806 |
| 6,485,250 B2 | * | 11/2002 | Hofmeister .............. 414/744.1 |
| 6,547,510 B1 | * | 4/2003 | Beaulieu .................. 414/744.5 |

FOREIGN PATENT DOCUMENTS

| | | |
|---|---|---|
| EP | 604066 A1 | 6/1994 |
| JP | 6104326 | 4/1994 |
| WO | WO 99 13488 | 3/1999 |

* cited by examiner

*Primary Examiner*—James W. Keenan
(74) *Attorney, Agent, or Firm*—Boult Wade Tennant

(57) ABSTRACT

An apparatus for processing wafers one at a time. The apparatus has a vacuum chamber 1 into which wafers are loaded through a pair of loadlocks 3, 4 which are spaced one above the other. A robot within the vacuum chamber 1 has a pair of gripper arms 22, 29 which are moveable along and rotatable about a vertical axis 23 so as to be moveable between the loadlocks 3, 4 and a wafer processing position. Each of the loadlocks 3, 4 has a vertically moveable portion 8, 26 which is moveable away from the remainder of the loadlock to provide access in a horizontal plane for one of the gripper arms 22, 29.

3 Claims, 5 Drawing Sheets

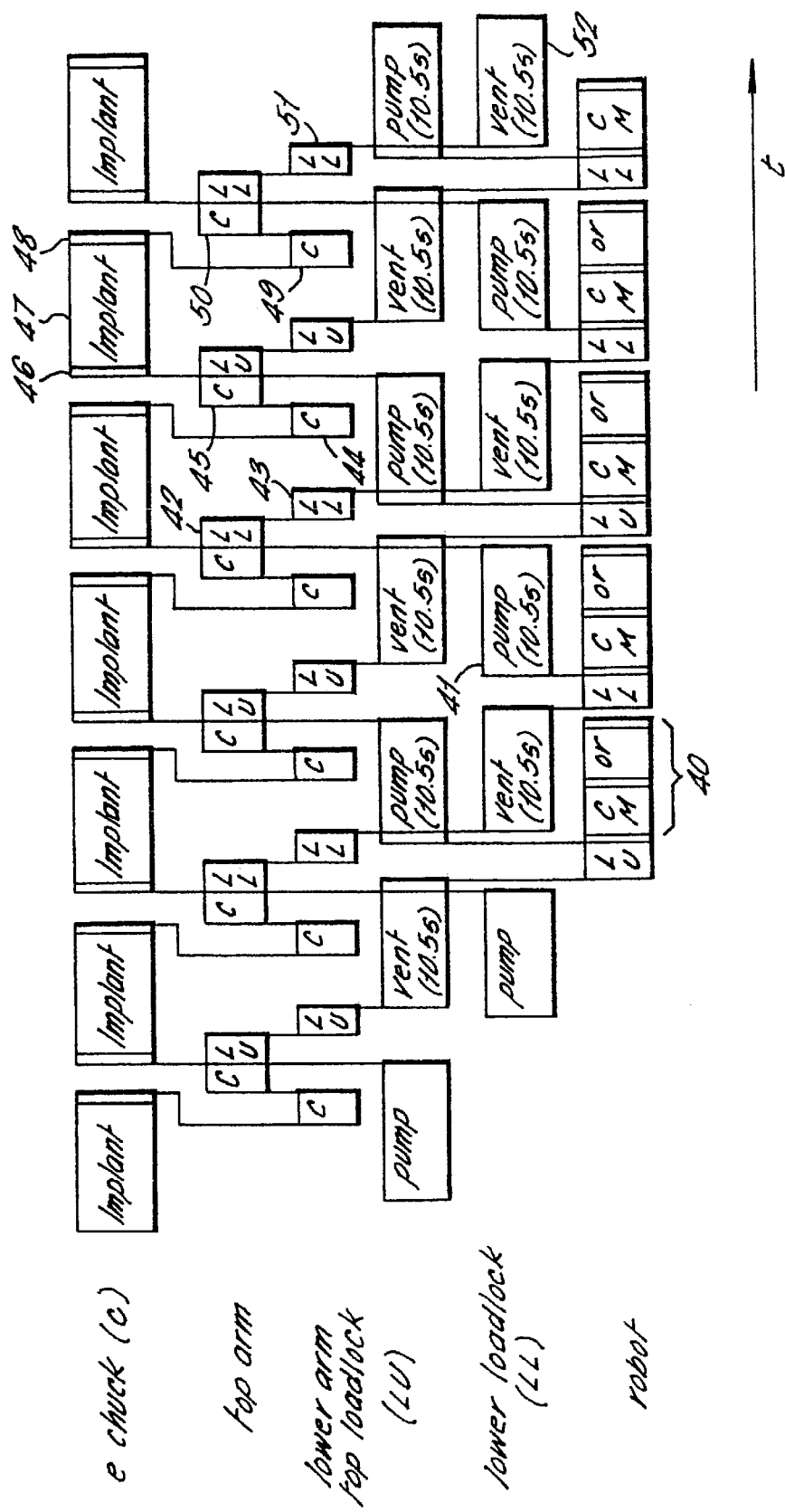

METHOD AND APPARATUS FOR PROCESSING WAFERS

This application is a divisional of application Ser. No. 09/293,939, filed on Apr. 19, 1999, now U.S. Pat. No. 6,350,097 the entire contents of which are hereby incorporated by reference and for which priority is claimed under 35 U.S.C. §120.

FIELD OF THE INVENTION

A present invention relates to a method and apparatus for processing wafers. The invention has particular application to ion implantation chambers for semiconductor wafers.

BACKGROUND OF THE INVENTION

In such ion implantation chambers, a wafer is scanned across an ion beam to introduce controlled doses of impurities into the wafer. The chamber in which the wafer is processed is evacuated.

In order to load the wafers into the vacuum chamber, a loadlock chamber is used to preserve the vacuum while loading wafers from the outside atmosphere. The loadlock chamber has an external valve to seal the loadlock chamber from the external atmosphere and an internal valve to seal the loadlock chamber from the vacuum chamber. With the internal valve closed and the external valve open, the wafer is loaded into the loadlock chamber from the atmospheric side. The external valve is then closed and the loadlock chamber is evacuated before the internal valve is opened and the wafer is transported into the vacuum chamber for processing. An example of such a loadlock is disclosed in EP-A-604,066.

In order to make most efficient use of the ion beam, and thus increase the throughput of the apparatus, the loading and unloading of the wafers into and out of the vacuum chamber must be done as quickly as possible. The present invention aims to improve the performance of the apparatus in this respect.

SUMMARY OF THE INVENTION

According to the present invention, an apparatus for processing wafers comprises a vacuum chamber in which the wafers are serially processed at a wafer processing position, two loadlocks through which the wafers are loaded into the vacuum chamber, and a mechanism for transporting the wafers from the loadlocks to the wafer processing position, each loadlock having an outer valve which is selectively operable to seal the loadlock from the external atmosphere, an inner valve which is selectively operable to seal the loadlock from the vacuum chamber, and a port for evacuation and pressurisation of the loadlock, wherein one loadlock is positioned above the other.

The use of two loadlocks which are preferably single wafer loadlocks allows wafers to be transported in parallel through the two loadlocks. Preferably a gripper arm is provided which is rotatable about an axis to access the loadlocks, and both loadlocks are positioned at the same radial distance from this axis. This allows the mechanisms for loading and unloading both loadlocks on one side of the loadlocks to share certain common parts. Preferably, the loadlocks are positioned one substantially directly above the other to allow this to be achieved with little or no increase in the footprint of the apparatus.

The internal and external valves of each loadlock can be slit valves in which a gate member is raised and lowered to uncover a slit allowing access to the loadlock chamber. Indeed, such valves are preferred for the external valves. However, preferably, each loadlock is a two-part structure, the two parts being movable together in a direction substantially perpendicular to the plane of the wafer to seal and provide the inner valve, and being movable apart in the opposite direction to break the seal and allow access to the wafer by a gripper arm pivoted about a single axis substantially perpendicular to the plane of the wafer.

To provide a more compact structure, it is preferred that the upper loadlock has an inner valve which is operable by upward movement of a top part, and the lower loadlock has an inner valve which is operable by downward movement of a lower part.

The wafers from both loadlock chambers can be picked up and set down by a robot which requires only axial motion in the direction of the axis about which the gripper arm is pivoted, and rotational motion about this axis. In fact, in order to allow a processed wafer to be loaded into the loadlock while an unprocessed wafer is being unloaded, a second gripper arm will be provided which is axially movable together with the first gripper arm. The second gripper arm is either disposed on the opposite side of the axis to the first gripper arm and is rotatable with the first gripper arm, or is positioned immediately below the first gripper arm and is rotatable about the axis independently of the first gripper arm. In the second case, which is preferred as it offers greater flexibility, the robot in the vacuum chamber is a three axis robot, having one linear and two rotational axes. This is advantageous over a conventional four axis robot as each additional axis required in a vacuum chamber increases the cost and the maintenance of the apparatus.

The robot forms an independent aspect of the present invention which can be broadly defined as a robot for transferring planar members from one location to another, the robot comprising a pair of coaxial shafts extending, in use, perpendicular to the plane of the planar members, each shaft having a gripper for gripping a planar member, the two shafts being rotatable independently about the axis and movable together along the axis, and a source of motive power for providing the axial and rotational motion.

The coaxial shafts also preferably contain air ducts for the supply of air to a pneumatic mechanism on each gripper arm for opening and closing the gripper arm. The coaxial shafts are preferably axially movable together by means of a lead screw.

The invention also extends to a method for loading wafers from an atmospheric source to a processing position within a vacuum chamber, the method comprising the steps of loading a wafer into a first loadlock chamber at atmospheric pressure, closing an external valve on the loadlock chamber and evacuating the loadlock chamber, opening an internal valve between the loadlock chamber and a vacuum chamber, transporting the wafer to the processing position, and repeating the process for a second loadlock chamber directly below the first loadlock chamber. Preferably access to the loadlocks requires a gripper arm rotatable about an axis, and both loadlocks are positioned at the same radial distance from this axis. The second loadlock chamber is preferably substantially directly below the first.

The transportation of the wafer to the processing position is preferably done by a robot having a gripper arm which is elevationally moveable along an axis which is substantially parallel to the direction in which the loadlock chambers are separated, and is rotatable about this axis, the method further comprising the steps of moving the gripper arm to a first elevational location aligned with the first loadlock chamber, rotating the gripper arm about the axis into the first loadlock chamber and picking up a wafer from the first loadlock chamber, rotating the gripper arm about the axis to transport the wafer to the processing position, depositing the wafer at the processing position, moving the gripper arm axially to a second elevational location aligned with the second loadlock chamber, and repeating the gripping, moving and depositing operations for a wafer from the second loadlock chamber.

BRIEF DESCRIPTION OF THE DRAWINGS

An example of a method and apparatus in accordance with the present invention will now be described with reference to the accompanying drawings, in which:

FIG. 5 is a throughput graph showing the movements of the various components of the apparatus.

DETAILED DESCRIPTION OF THE PREFERRED EMBODIMENTS

The ion implantation apparatus is broadly the same as that disclosed in WO99/13488.

The apparatus comprises a vacuum chamber into which wafers are loaded independently onto an electrostatic chuck (hereafter referred to as an e-chuck). In operation an individual wafer is electrostatically clamped on the e-chuck and is held vertically and is scanned by a horizontally scanning ion beam.

The arm which supports the e-chuck extends out of the vacuum chamber and is supported by a linear motion mechanism for reciprocably moving the e-chuck vertically so that the entire surface of a wafer on the e-chuck is scanned by the ion beam. The linear motion mechanism itself is mounted so as to be rotatable about a horizontal tilt axis which allows the angle between the wafer and the ion beam to be varied. The e-chuck is further provided with a mechanism for rotating the wafer about an axis passing through a centre of the wafer and perpendicular to the plane of the wafer. The mechanism thus far described is as that shown in WO99/13488. Further, the arm itself is independently rotatable about the horizontal tilt axis through 900 so that it can be moved from the vertical scanning position to a horizontal loading position.

Figure 1:
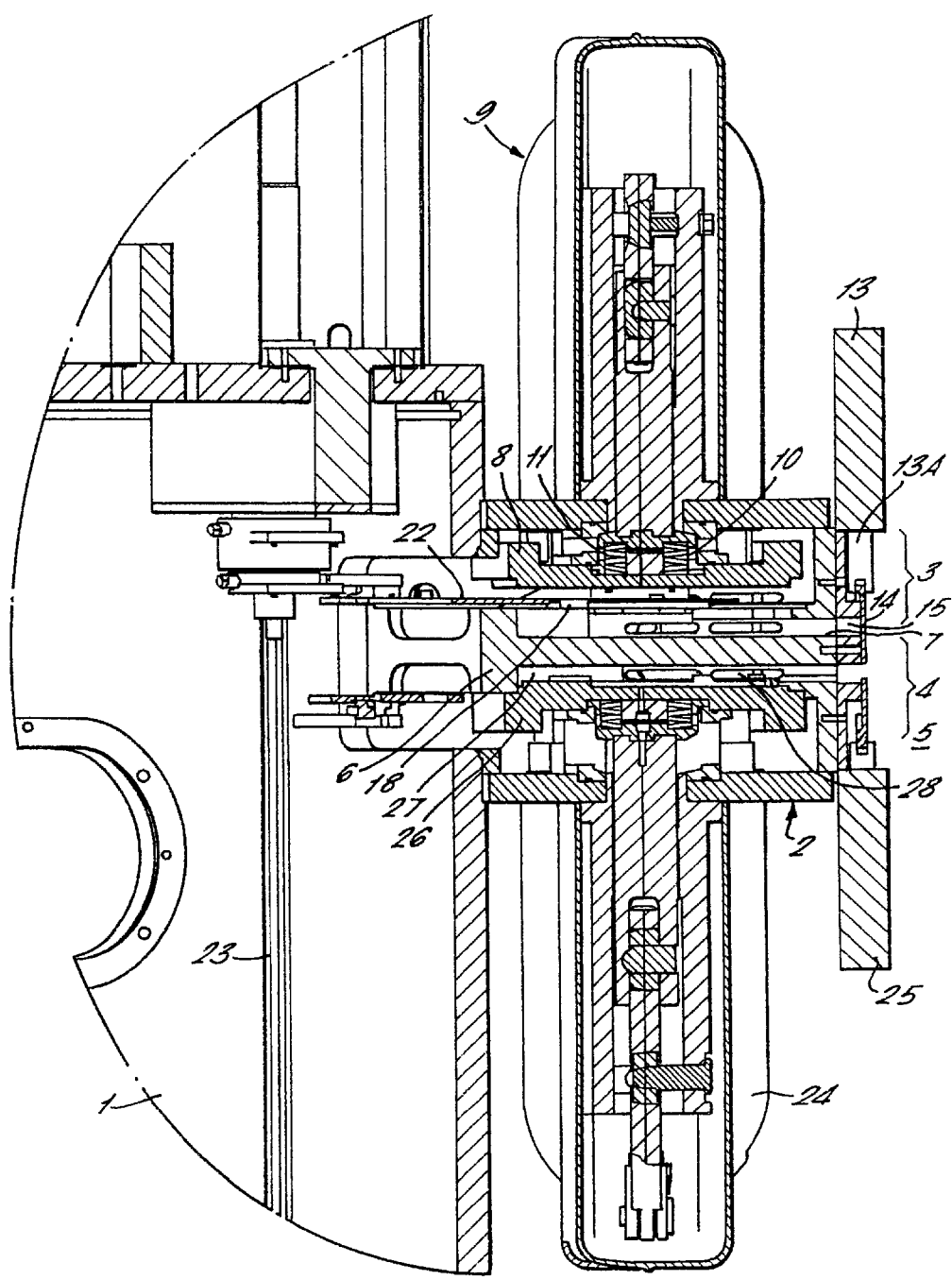
FIG. 1 is a schematic cross-section from one side through the two loadlock chambers and a portion of the vacuum chamber.
Figure 2:
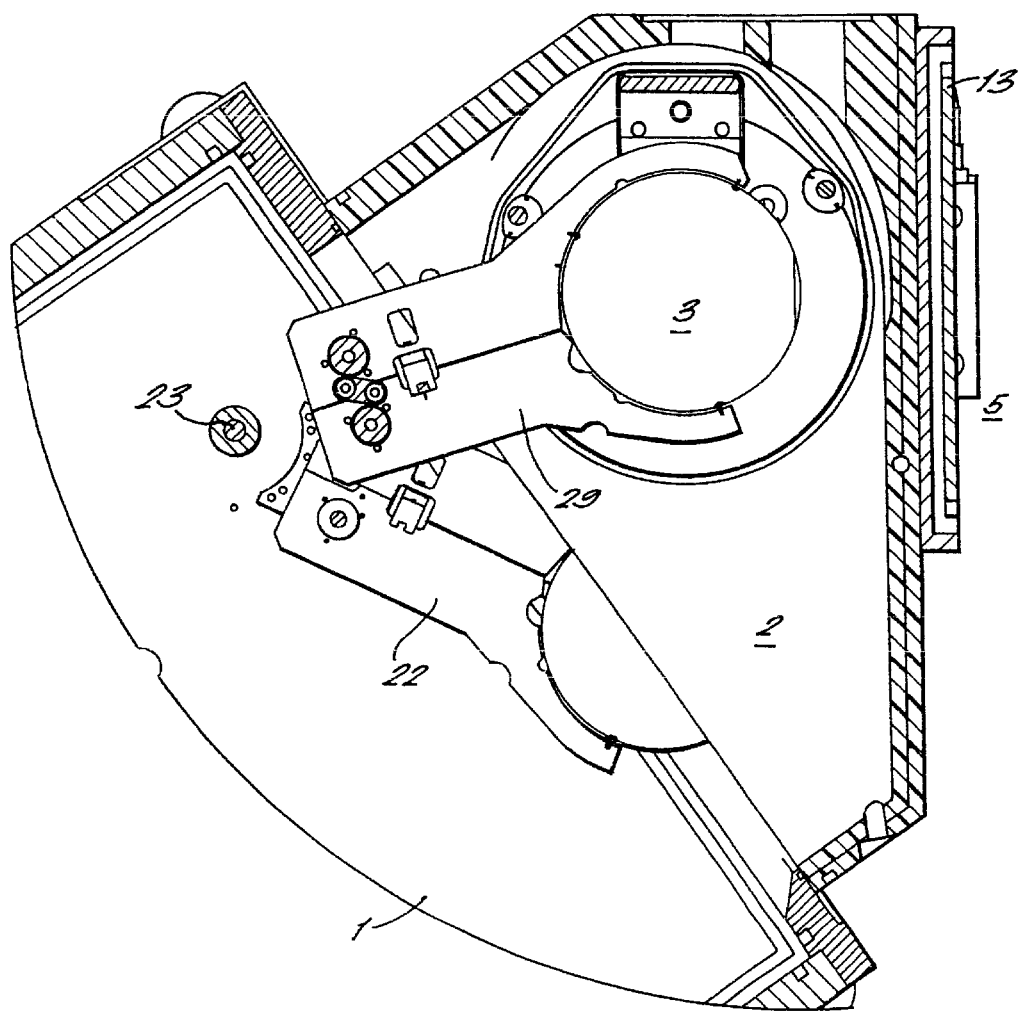
FIG. 2 is a schematic plan view of the arrangement shown in FIG. 1.

The arrangement for loading the wafers into the vacuum chamber of the present invention is shown in FIGS. 1 and 2. The apparatus broadly comprises the vacuum chamber 1 containing the e-chuck (not shown), a loadlock assembly 2 comprising an upper loadlock 3 and a lower loadlock 4, and an external atmospheric portion 5. The upper loadlock 3 is directly above the lower loadlock 4 in the sense that the wafers retained in the two loadlocks have their centres on the same vertical axis.

In the external atmospheric portion 5 are a number of magazines which provide a source of a wafers to be treated in the ion implantation apparatus, and receive the treated wafers from the ion implantation apparatus.

The loadlock assembly 2 comprises a loadlock housing 6 which has a central plate 7 separating the upper 3 and lower 4 loadlocks. The upper 3 and lower 4 loadlocks are positioned as close together as possible in the vertical direction to minimise the movement required to load and unload wafers from both loadlocks. The upper loadlock 3 is provided with a lid valve 8 which is elevationally movable by a cam mechanism 9 mounted directly above the upper loadlock 3. A bellows 10 provides a vacuum seal for the cam actuator 9, and a spring 11 provides a degree of preloading for the lid valve 8, and absorbs any dimensional tolerances between the lid valve 8 and the housing 6. To provide access for a wafer 12 into the vacuum chamber, the lid valve 8 is raised to the position shown in FIG. 1 allowing lateral access to the wafer on the depending feet for a gripper arm as described below. In FIG. 1 the upper loadlock 3 is shown open to the vacuum chamber 1 with the wafer being in the process of being removed into the vacuum chamber. Access to the atmospheric side of the loadlock is provided by a slit valve 13 in which the gate element 14 can be raised and lowered on an activator 13A in order to seal across a slit 15 through which the wafer can enter the upper loadlock 3.

Figure 3:
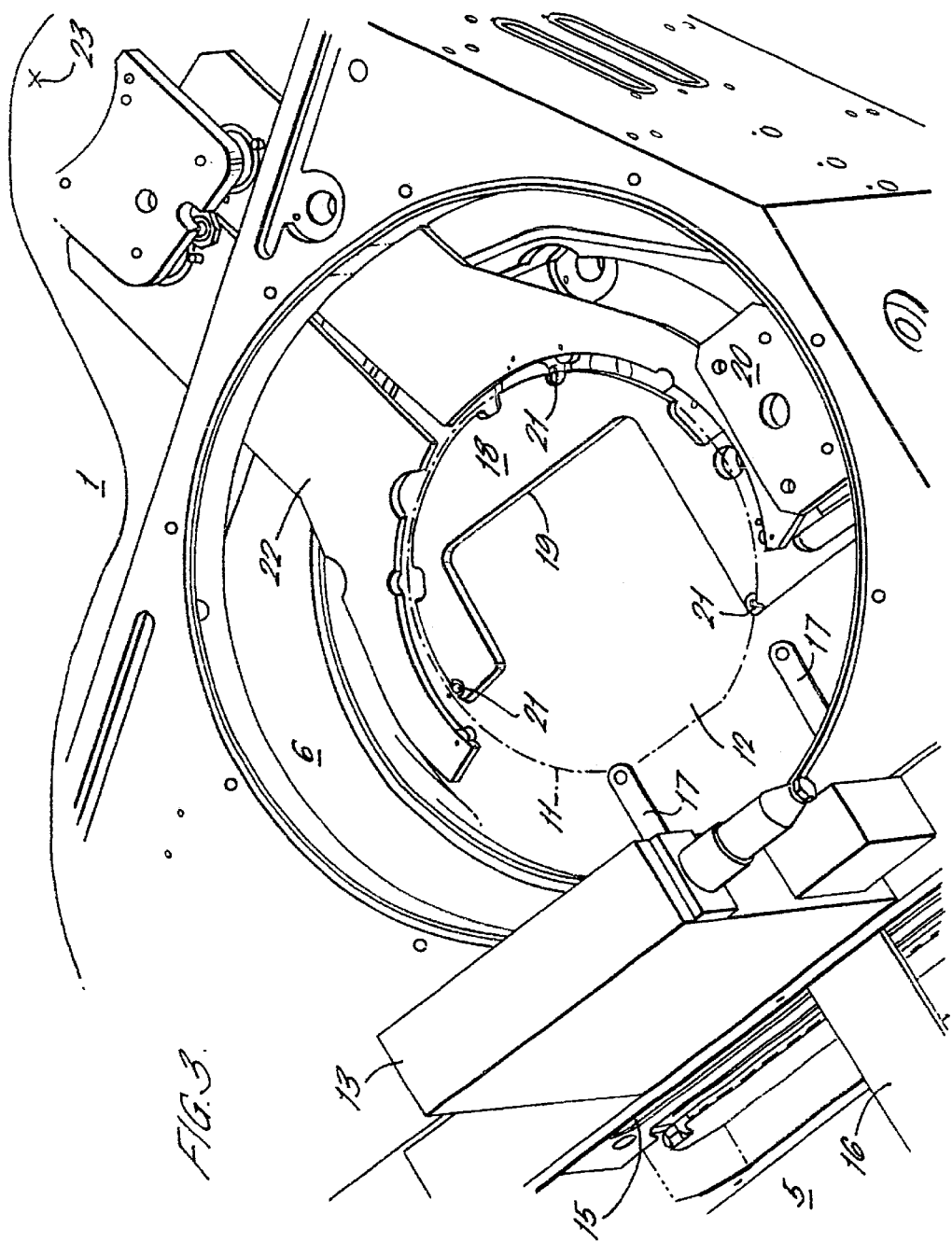
FIG. 3 is a perspective view of the upper loadlock with the lid valve removed.

The mechanism for loading and unloading a wafer 12 from the upper loadlock 3 is shown in more detail in FIG. 3. It should be understood that this figure is schematic, in the sense that it shows both the valve to the vacuum chamber 1 and the valve to the atmosphere 5 open and the mechanisms for transferring the wafer from either side being deployed into the loadlock. Of course, in practice, only one valve will be open at any one time, and only one of the deployment mechanisms will be in place.

An end effector 16 of an atmospheric robot is shown projecting through the slit 15. Within the loadlock, the end effector is represented by a pair of parallel fingers 17, but in practice will project beneath the wafer 12 shown in outline only in FIG. 3, so as to support the wafer. A loadlock carrier 18 is provided to support the wafer in the loadlock. The loadlock carrier 18 has an outer profile which substantially matches the circular profile of the wafer. The opposite side of the loadlock carrier 18 has straight sided recess 19 which is shaped so as to allow the end effector 16, 17 to pass through the loadlock carrier from above as will be described. The loadlock carrier 18 has an upwardly projecting flange which leads up to a bracket 20 with which it is integral. This bracket 20 is rigidly fixed to the lid valve 8, so that the whole loadlock carrier 18 moves up and down with the lid valve 8. Three feet 21 are provided on the upper surface of the loadlock carrier so as to receive the wafer. When the lid valve 8 is raised, the loadlock 3 can be accessed by a gripper arm 22 moving in a horizontal plane about a vertical axis 23.

In order to place a wafer 12 on the loadlock carrier 18, the end effector 17 carrying a wafer 12 is moved through the slit 15 as shown in FIG. 3. The end effector is then moved downwardly through the recess 19 in the loadlock carrier 18 until the wafer is supported by the three feet 21. The end effector is then moved further downwardly so as to be clear of the wafer 12 and is then withdrawn through the slit 15. All of this is done with the lid valve 8 in its lowered or closed position. Once the loadlock chamber has been evacuated, the lid valve 8 is raised, bringing the loadlock carrier 18 and wafer 12 with it. The gripper arm 22 is then swung into the position shown in FIG. 3, and is then moved downwardly, or the loadlock carrier 18 is moved upwardly so that it can grip the edge of the wafer 12 and withdraw it from the loadlock carrier.

The lower loadlock 4 has a similar design to the upper loadlock, in that the cam mechanism 24 and slit valve 25 are of the same construction, but in an inverted configuration. In the lower loadlock, there is no need to provide a the loadlock carrier to support the wafer, as the wafer can be directly supported by feet on the upper surface of lower lid valve 26. The lower lid valve will need a recess of similar shape to the recess 19 between the feet to allow the end effect to place the wafer on the feet and be withdrawn.

In FIG. 1 the loadlock is shown in its raised/closed position in which the lower lid valve 26 seals around its periphery with the housing 6 thereby providing a seal between the lower loadlock 4 and the vacuum chamber 1 and defining a sealed loadlock chamber 27 between the lower surface of plate 7 of the housing 6 and the upper surface of lower lid valve 26. The volume of the loadlock chambers of the upper 3 and lower 4 loadlocks is kept to a minimum to minimise the pumping and venting required.

In the configuration of FIG. 1 and with slit valve 25 open, a wafer can be loaded into the loadlock chamber 27 and is supported by the feet on the lower lid valve. The slit valve 25 is then closed and the loadlock chamber 27 is evacuated through evacuation port 28. The lower lid valve 26 can then be lowered breaking the seal on the vacuum chamber side and providing access to the loadlock chamber 27 from the vacuum chamber 1.

The robot mechanism for transferring the wafers from the loadlock mechanism 2 to the e-chuck will now be described in more detail. In addition to the gripper arm 22 shown in FIG. 3, which will subsequently be referred to as the lower gripper arm, the robot further comprises upper gripper arm 29 of the same construction. The two arms are mounted adjacent to one another so as to be movable together along a vertical axis 23 and rotatable independently about the vertical axis 23.

Figure 4:
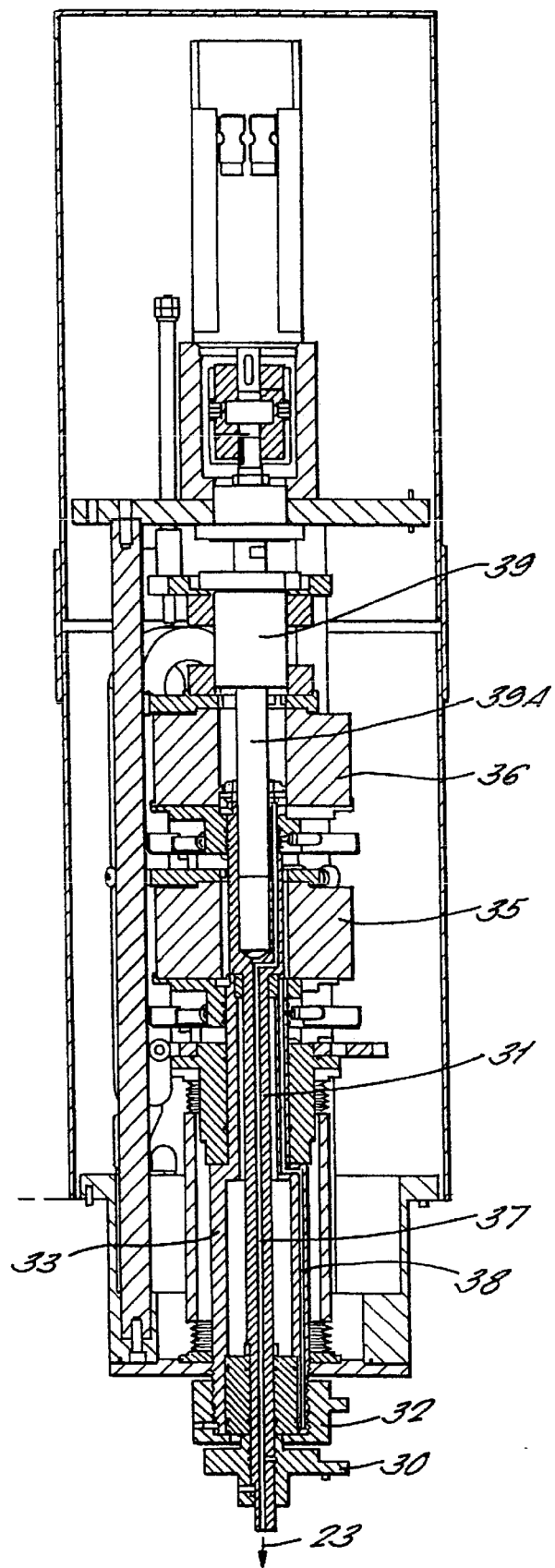
FIG. 4 is a cross-section of the drive mechanism for the two gripper arms in the vacuum chamber.

The mechanism for operating the gripper arms is shown in FIG. 4. The lower gripper arm 22 is attached via hub 30 to an inner shaft 31. The upper gripper arm 29 is attached via hub 32 to an outer shaft 33. The inner shaft 31 is rotated by a motor 35, while the outer shaft 33 is rotated by motor 36. Vacuum seals for the two shafts are provided by ferro-fluidic seals. Air ducts 37, 38 allow the transmission of air to the gripper arms for the pneumatic opening and closing operations of these arms. A third motor 39 rotates a feed screw shaft 39A to provide the axial movement of the two gripper arms 22, 29 together along the axis 23.

The purpose having the pair of gripper arms 22, 29 is that when one is unloading a wafer at a particular location, the other can immediately load a wafer at that location without having to wait for the first one to return with a further wafer for loading. The e-chuck may be at the same elevational height as one of the loadlocks 3, 4, such that elevational movement of the gripper arms 22, 29 is only required when moving wafers between the e-chuck and the loadlock which is elevationally offset from the e-chuck. On the other hand, the e-chuck may be elevationally between the two loadlocks, requiring a smaller elevational movement of the gripper arms each time a wafer is transferred.

The entire loading/unloading operation of this apparatus will now be described with particular reference to FIG. 5. The key to this figure is that five components, namely e-chuck (c), top arm, lower arm, top loadlock (LU), lower loadlock (LL) and the robot for loading wafers from the atmospheric side into the two loadlocks are listed in the left hand column. The operation of each of these components at any one time is listed in the shaded boxes immediately to the right of each listed component. The letters included in these boxes refer to the location to which the component has travelled at any particular time. For example, the box containing (c) in the line indicating the position of the lower arm means that, at this time, the lower arm is at the e-chuck. The letter (M) in the line for the robot refers to a magazine on the atmospheric side supplying wafers to the implant apparatus, and the letters (or) in the line for the robot refer to an ion orientation apparatus for correctly orientating the wafer before it is placed in the loadlock mechanism 2.

The operation of the apparatus can most clearly be described by referring to the passage of a single wafer (hereafter referred to as the wafer in question) through the apparatus from the time that an untreated wafer leaves the magazine (M) to the time that the treated wafer is returned to the magazine (M). It should be understood that, every time the wafer is deposited at a particular location, the wafer which is one step ahead of the wafer in question will just have been removed from this location. Also each time the wafer is picked up from a particular location, it will be replaced by a later wafer which is one stage behind in the process.

The wafer in question is picked up by the atmospheric robot from the magazine (M) and transferred to the orientation mechanism (or) where it is rotated to the correct orientation as shown at 40 in FIG. 5. On its next pass, the atmospheric robot picks the wafer in question out of the orientation mechanism (or) and transfers it to the lower loadlock 4. At this time, the apparatus has the lower slit valve 25 open and the lower lid valve 26 raised. Once the wafer in question is in place, the slit valve 25 is closed and the loadlock chamber 27 is evacuated as shown at 41 in FIG. 5. It will be understood that the atmospheric robot loads the upper 3 and lower 4 loadlocks alternately as shown on the bottom line of FIG. 5.

Once the loadlock chamber 27 is evacuated, the lower lid valve 26 is lowered by the cam mechanism 24. The wafer in question is now in a position in which it can be gripped by upper gripper arm 29 as indicated at 42 in FIG. 5. As mentioned above, it will be understood that the lower arm 22 then moves a treated wafer in the opposite direction into the lower loadlock 4 as indicated at 43 in FIG. 5. The upper gripper arm 29 with the wafer in question then rotates about axis 23 towards the e-chuck and waits. While this is happening, the lower gripper arm 22 which is now not carrying a wafer moves to the e-chuck and picks up the wafer which has just been scanned as indicated at 44 and FIG. 5. The wafer in question is then put onto the e-chuck as indicated at 45 in FIG. 5. The e-chuck is then electrostatically activated to attract the wafer in question to the chuck, and is rotated from its horizontal loading configuration to a vertical scanning configuration which takes approximately one second and is illustrated at 46 in FIG. 5. The wafer in question is then scanned with the ion beam as previously described and as indicated in 47 in FIG. 5. Once this operation is complete, the e-chuck returns to the horizontal loading configuration as indicated by 48 in FIG. 5, whereupon the lower gripper arm 22 retrieves the wafer in question as illustrated at 49 in FIG. 5. The upper gripper arm 29 loads the next wafer to be treated onto the e-chuck as indicated at 50 in FIG. 5. The lower arm then rotates about axis 23 and transports the wafer in question to the lower loadlock 4 as indicated at 51 in FIG. 5. At this time, the lower lid valve 26 is in its lowered position and the slit valve 25 is closed. Once the wafer in question is in place, the lower lid valve 26 is raised and the loadlock chamber 27 is vented back to atmospheric pressure as indicated at 52 in FIG. 5 through port 28, or a separate port. Once the chamber has been vented, the slit valve 25 opens and the wafer is collected by the atmospheric robot and returned to the magazine containing completed wafers.

As is apparent from FIG. 5, while one of the loadlocks 3, 4 is being pumped to vacuum, the other is being vented to atmosphere almost simultaneously, but slightly later. This means that while the treated wafer is being transported out of the vacuum chamber through one loadlock, an untreated wafer is being transported in through the other. This allows a regular supply of wafers to the e-chuck, thereby reducing the gap between implant operations.

With the apparatus of this invention it will be possible to process up to 270 wafers per hour, as opposed to about 200 per hour in the prior art.

What is claimed is:

1. A robot for transferring planar members from one location to another, the robot comprising:

a pair of coaxial shafts having a common axis extending, in use, perpendicular to the plane of the planar members, each shaft having, a respective rigid robot arm arm attached thereto carrying a respective gripper for gripping a planar member, at a fixed radial distance from said common axis, the two shafts with said respective attached robot arms and grippers being rotatable independently about the axis and movable together along said axis, and a source of motive power for providing the axial and rotational motion.

2. A robot according to claim 1, wherein each gripper has a pneumatic mechanism for opening and closing the gripper to respectively release and grip a said planar member, and the coaxial shafts contain air ducts for the supply of air to actuate said pneumatic mechanisms.

3. A robot according to claim 1, including a lead screw operable to effect said movement of the coaxial shafts along said axis.

* * * * *